US008760321B2

(12) United States Patent
Chiu

(10) Patent No.: US 8,760,321 B2
(45) Date of Patent: Jun. 24, 2014

(54) METHOD FOR DETECTING AND PROCESSING KEY SCAN CODES OF COMPUTER KEYBOARD

(75) Inventor: Chai-Chang Chiu, Tucheng (TW)

(73) Assignee: Getac Technology Corporation, Hsinchu County (TW)

( * ) Notice: Subject to any disclaimer, the term of this patent is extended or adjusted under 35 U.S.C. 154(b) by 1698 days.

(21) Appl. No.: 12/005,325

(22) Filed: Dec. 27, 2007

(65) Prior Publication Data

US 2009/0027236 A1 Jan. 29, 2009

(30) Foreign Application Priority Data

Jul. 27, 2007 (CN) .......................... 2007 1 0029415

(51) Int. Cl.
*H03K 17/94* (2006.01)
*H03M 11/00* (2006.01)

(52) U.S. Cl.
USPC .................................. 341/26; 341/20; 341/22

(58) Field of Classification Search
USPC ............................................... 341/20, 22, 26
See application file for complete search history.

(56) References Cited

U.S. PATENT DOCUMENTS

| | | | | |
|---|---|---|---|---|
| 5,333,273 | A | * | 7/1994 | Raasch et al. .................... 710/67 |
| 5,402,121 | A | * | 3/1995 | Noorbehesht .................... 341/26 |
| 5,557,299 | A | * | 9/1996 | Maynard et al. ............. 345/168 |
| 5,802,318 | A | | 9/1998 | Murray et al. |
| 6,181,262 | B1 | * | 1/2001 | Bennett ............................ 341/26 |
| 6,429,793 | B1 | * | 8/2002 | Paolini ............................ 341/22 |
| 6,802,015 | B2 | * | 10/2004 | Atkinson ....................... 713/322 |
| 7,264,473 | B1 | * | 9/2007 | Williams ........................ 434/227 |
| 2002/0124197 | A1 | * | 9/2002 | Atkinson ....................... 713/322 |
| 2003/0193420 | A1 | * | 10/2003 | Wang .............................. 341/26 |
| 2004/0104893 | A1 | * | 6/2004 | Huang .......................... 345/168 |
| 2004/0125152 | A1 | | 7/2004 | Sommers et al. |
| 2004/0222963 | A1 | * | 11/2004 | Guo et al. ..................... 345/156 |
| 2005/0050232 | A1 | * | 3/2005 | Yoshioka .......................... 710/1 |
| 2005/0179664 | A1 | * | 8/2005 | Lee ............................... 345/168 |

FOREIGN PATENT DOCUMENTS

| | | |
|---|---|---|
| CN | 1402142 A | 3/2003 |
| EP | 0358716 B1 | 8/1993 |
| EP | 0991955 A1 | 4/2000 |
| JP | 6309081 A | 11/1994 |

* cited by examiner

*Primary Examiner* — Hai Phan
*Assistant Examiner* — Amine Benlagsir

(57) ABSTRACT

A method for detecting and processing key scan codes of a computer keyboard is disclosed. At least one scan code table is established for a computer device in advance and is stored in a scan code table memory that is accessible by a keyboard controller so that the keyboard controller, after initialization, may load the scan code table from the scan code table memory to a scan code table load-in area within the keyboard controller. The keyboard controller, upon detecting the actuation of any key of the keyboard, generates a interrupt request signal to the south bridge, which in turn retrieves the scan code; or alternatively, the keyboard controller generates an interrupt signal to the south bridge, which in turn retrieves and transmits the interrupt query number of the interrupt signal to the computer operating system, which in turn executes a preset target program corresponding to the interrupt query number.

10 Claims, 7 Drawing Sheets

| Key | Scan Code |
|---|---|
| K11 | C11 |
| K12 | C12 |
| K13 | C13 |
| ⋮ | ⋮ |
| K1n | C1n |
| K21 | C21 |
| K22 | C22 |
| K23 | C23 |
| ⋮ | ⋮ |
| K2n | C2n |
| K31 | C31 |
| K32 | C32 |
| K33 | C33 |
| ⋮ | ⋮ |
| K3n | C3n |

Rows 1–n grouped as G1, rows n+1–2n as G2, rows 2n+1–3n as G3.

*FIG.3*

METHOD FOR DETECTING AND PROCESSING KEY SCAN CODES OF COMPUTER KEYBOARD

FIELD OF THE INVENTION

The present invention relates to a method for detecting and processing key signals for a computer keyboard, and in particular to a method for detecting and processing key scan codes for a programmable computer keyboard.

BACKGROUND OF THE INVENTION

A keyboard is an important input measure for a computer device, which is applicable to enter such as numbers, characters/texts, and control instructions. A regular desktop computer uses a keyboard in the form of an independent module, which is connected to a keyboard port of the computer via a connection cable and associated connectors. Currently, wireless transmission technology is also applicable to the connection between a computer keyboard and a host computer device.

However, in a notebook computer, most of the currently available designs adopt an embedded keyboard that is built in the enclosure of the notebook computer to allow a user to directly enter number, characters/texts and control instructions to the notebook computer.

In the current design of notebook computer, in order to detect the stroke condition of the actuation of each key of the keyboard, most of the systems are provided with a keyboard controller and hardware wiring of key matrix is employed to detect and process the actuation of the keys. In other words, when a user depresses one key of the keyboard, the keyboard controller scans a number (hardware wiring) and a scan code table established in the keyboard controller generates an interrupt request signal corresponding to the scanned number to request a south bridge of the computer to receive the scan code or to generate an SMI event signal, an SCI event signal or an interrupt event signal.

In prior patent documents, various corresponding technologies are available. For example, U.S. Pat. No. 6,456,277 discloses a data conversion method for detection of various types of keyboard. The known technology provides a specific data conversion method to address the situation that a networked computer system may include various types of keyboard, and the method is carried out by first converting a signal of a key into a virtual scan code, which is then converted a keyboard scan code that is compatible to a management end of the networked computer system. In this respect, two scan code tables are needed.

U.S. Pat. No. 6,574,517 discloses a key processing method for a keyboard device, which employs multiple key code technologies to identify and process the keys.

Further, U.S. Pat. No. 5,631,643 discloses a data processing device that is connectable between two keyboards of different characters and the processing of the data processing device. A switchable connection port is arranged and connected between the keyboards.

SUMMARY OF THE INVENTION

Although the conventional technology for keyboard signal processing and code scanning has been commonly used for years, there are still drawbacks to be overcome. For example, to change the scan code of a keyboard of SMI, SCI or interrupt, the scan code table built in the keyboard controller must be modified. And, to change the scan code table of the keyboard controller means different version of the keyboard controller must be adopted. Thus, for a customized portable product, such as a notebook computer and a palmtop computer, multiple versions of the keyboard controller must be provided. To conclude, the drawbacks of the currently keyboard technology are listed as follows:

(1) Variation of an existing keyboard is generally not available. For the same portable computer product, if a first customer requires a first type of keyboard, while a second customer needs a second type, then two different versions of keyboard controller must be provided by the computer manufacturers. This increases the likelihood of mistakenly burning wrong version of operating system and also lengthens the time needed for manufacturing.

(2) The manufacturers must modify programming of keyboard in order to suit the needs of specific customers and this may cause difference in recognition of keyboard, leading to delay of shipping of product.

(3) Conventionally, the scan code table is built in the keyboard controller in a hardware form, so that modification of the scan code table requires modification or change of the program codes of the keyboard.

For today's computer applications, which can be realized in different countries, using different languages and different operating systems and containing computers provided by different manufacturers, those problems are even more severe for both users and manufacturers of keyboards and computers.

Thus, an objective of the present invention is to provide a method for detecting and processing key scan codes applicable to a computer keyboard, wherein the scan codes of the keys are provided to the keyboard controller in such a way that after the keyboard controller is initialized, the keyboard controller loads a scan code table to a scan code table load-in area of the keyboard controller to serve as a basis for detection and identification for key scanning of the keyboard.

Another objective of the present invention is to provide a method for detecting and processing key scan code applicable to a computer keyboard, wherein a scan code table is stored in a scan code table memory that is accessible by the keyboard controller so that a user may update the scan code table by simply using graphic or non-graphic imputer interface of application programs.

To overcome the drawbacks discussed above, the present invention provides a solution, which resides in a method that first establishes at least one scan code table and stores the scan code table in a scan code table memory that is accessible by a keyboard controller so that a keyboard controller, after initialization, may load the scan code table from the scan code table memory to a scan code table load-in area within the keyboard controller. The keyboard controller, upon detecting the actuation of any key of a keyboard, generates an interrupt request signal to a south bridge of the associated computer host, which in turn retrieves the scan code; or alternatively, the keyboard controller generates an interrupt signal to the south bridge, which in turn retrieves and transmits the interrupt query number of the interrupt signal to the computer operating system, which in turn executes a preset target program corresponding to the interrupt query number.

BRIEF DESCRIPTION OF THE DRAWINGS

The present invention will be apparent to those skilled in the art by reading the following description of preferred embodiments thereof, with reference to the attached drawings, in which:

FIG. 3 shows data correlation of a scan code table with a plurality of sets of scan codes;

DETAILED DESCRIPTION OF THE PREFERRED EMBODIMENTS

Figure 1:
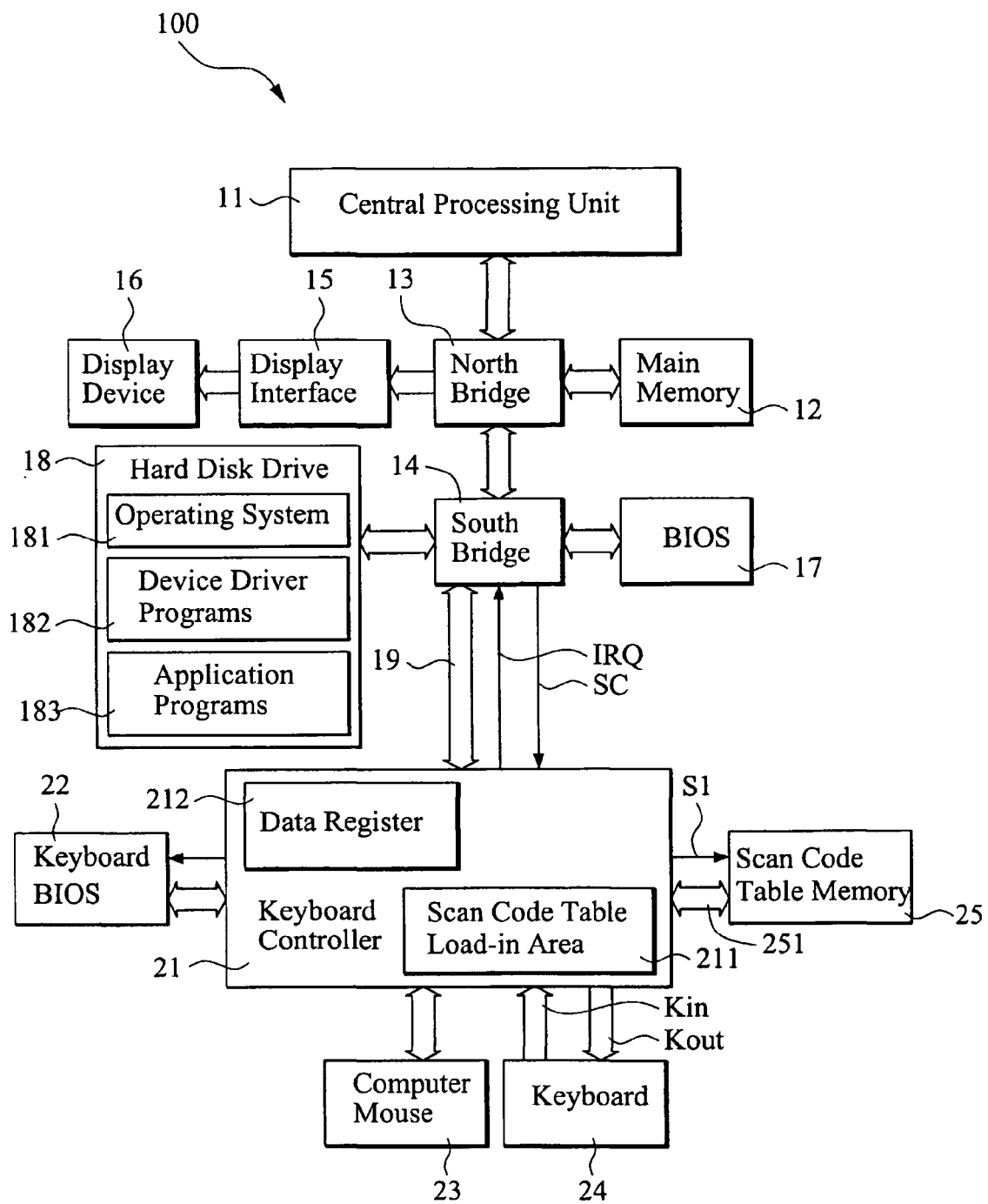
FIG. 1 shows a schematic system connection diagram in accordance with a first embodiment of the present invention.

With reference to the drawings and in particular to FIG. 1, which shows a schematic system connection diagram in accordance with a first embodiment of the present invention, a computer device 100 comprises generally a central processing unit 11, a main memory 12, a north bridge 13, which is also referred to as a first bus bridge, a south bridge 14, which is also referred to as a second bus bridge, a display interface 15, a display device 16, a basic input/output system (BIOS) 17, and a hard disk drive 18.

The north bridge 13 is connected via the display interface 15 to the display device 16. The south bridge 14 is connected to the BIOS 17 and the hard disk drive 18. The hard disk drive 18 stores therein an operating system 181, such as Microsoft WINDOWS®, which is currently and most commonly known, various device driver programs 182 for the computer device, and application programs 183.

A keyboard controller 21 is connected through a bus 19, which can be for example a PCI bus, to the south bridge 14. The keyboard controller 21 is connected to a keyboard basic input/output system (KB-BIOS) 22, a computer mouse 23, a keyboard 24. The keyboard 24 comprises a plurality of keys or pushbuttons, which are arranged in an array. Each key is provided with a character or figure or symbol representing the key. The keyboard 24 is connected by flat cables Kin, Kout to a preset input/output port of the keyboard controller 21.

In a commercially available keyboard, there are also fast key sets, and the operation or depressing status of the fast key sets are detected by the keyboard controller 21. The function of each fast key set is defined by a user or a corresponding program. When the user depresses any of the fast keys, a preset function or corresponding program associated with the depressed single-key fast key can be actuated for immediate execution.

Figure 2:
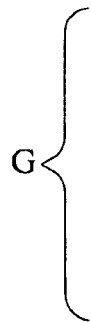
FIG. 2 shows data correlation of a scan code table.

As shown in FIG. 2, which shows data correlation table of a scan code table, in a scan code table G, each key K1, K2, K3, . . . , Kn corresponds to a preset scan code C1, C2, C3, . . . , Cn. When any key of the keyboard 24 is depressed, the scan code of the key is generated and applied to the keyboard controller 21. The keyboard controller 21, once detecting the scan code, identifies the key that is depressed.

A scan code table memory 25 stores data of the scan code table as that shown in FIG. 2. The scan code table memory 25 is an external memory and is connected via a bus 251 to the keyboard controller 21. Thus, the keyboard controller 21 may access, through the bus 251, the correlated data of keys and scan codes stored in the scan code table memory 25.

The scan code table memory 25 can be for example a regular erasable and writable memory, such as an electrically erasable programmable read-only memory (EEPROM) or a flash memory, to allow a user to update or modify the correlated data of keys and scan codes stored in the scan code table memory 25. To update or modify the correlated data of keys and scan codes stored in the scan code table memory 25, a user may use graphic or non-graphic input interface of application programs to update or modify the correlated data of keys and scan codes stored in the scan code table memory 25.

The scan code table memory 25 can store only one set of scan code in a scan code table, such as that shown in FIG. 2, or if desired, stores a plurality of sets of scan codes in a single scan code table. As shown in FIG. 3, which demonstrates a scan code table with a plurality of sets scan codes G1, G2, G3, the first scan code table G1 is comprised of a plurality of keys K11, K12, K13, . . . , K1n and associated or correlated scan codes C11, C12, C13, . . . , C1n. The second scan code table G2 is comprised of a plurality of keys K21, K22, K23, . . . , K2n and associated or correlated scan codes C21, C22, C23, . . . , C2n. And, the third scan code table G1 is comprised of a plurality of keys K31, K32, K33, . . . , K3n and associated or correlated scan codes C31, C32, C33, . . . , C3n. The keyboard controller 21 can be set by the user to apply a selection signal S1 to select the scan code tables G1, G2 or G3 to be loaded.

Figure 4:
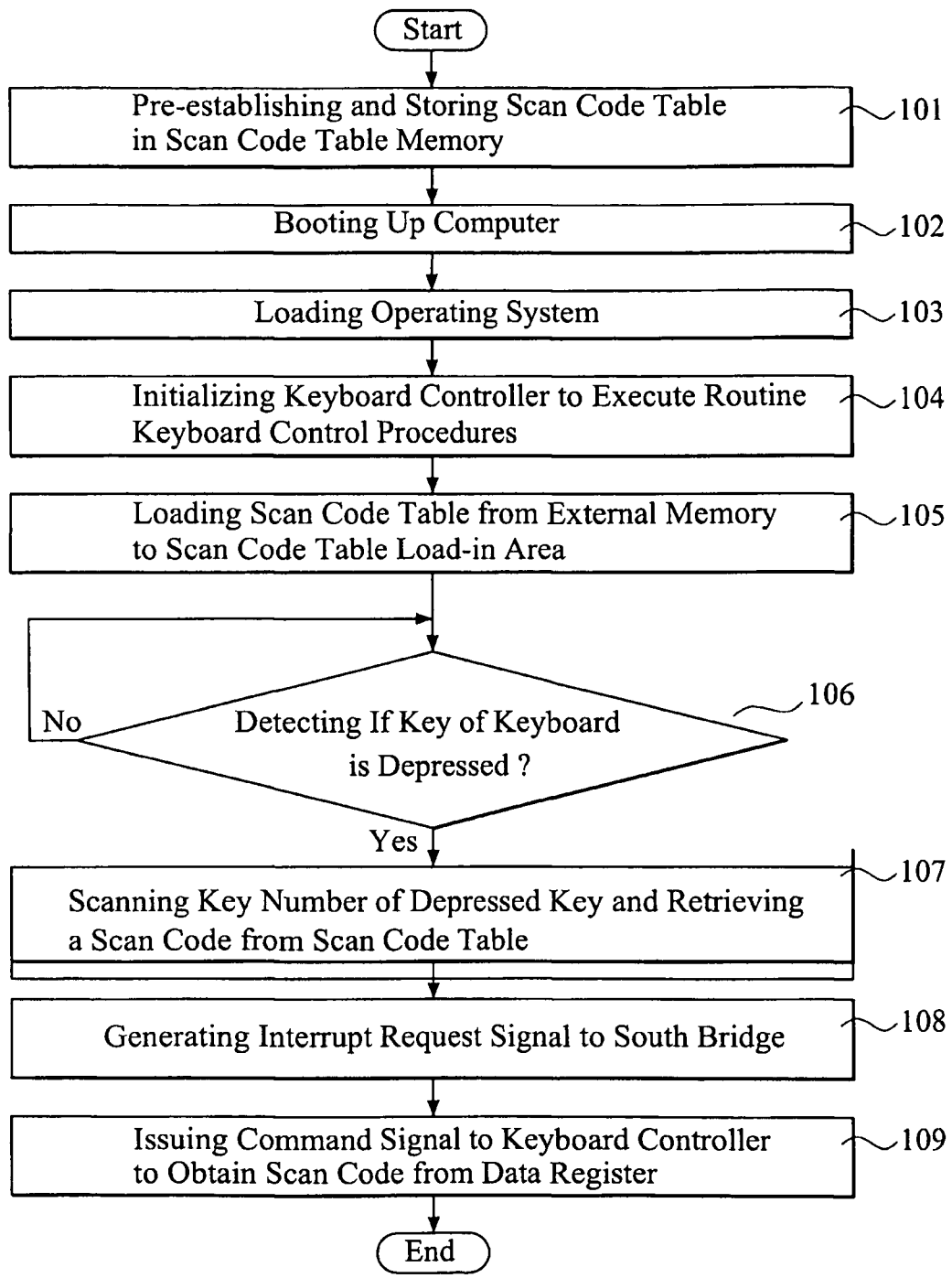
FIG. 4 shows a flow chart of the first embodiment illustrated in FIG. 1.

FIG. 4 shows a flow chart of the first embodiment illustrated in FIG. 1. The flow chart in accordance with the present invention will be described with further reference to FIGS. 1 and 2, which have been discussed previously.

First of all, a scan code table is pre-established in the computer device 100 and is stored in the scan code table memory 25 (step 101). When the computer 100 is booted up (step 102) and loads in an operating system (step 103), the keyboard controller 21 is initialized to execute routine keyboard control procedures (step 104), such as battery detection, keyboard detection, and ON/OFF status detection.

At this time, in step 105, the keyboard controller 21 loads the scan code table from the external memory (the scan code table memory 25) to a scan code table load-in area 211 inside the keyboard controller 21, which can be for example a random access memory or a register built in the keyboard controller 21.

When the keyboard controller 21 detects one of the keys of the keyboard 24 is depressed or struck by a user (step 106), the keyboard controller 24 scans a key number of the depressed key, based on which the keyboard controller 24 retrieves a scan code from the scan code table that is previously loaded (step 107).

Thereafter, the keyboard controller 21 generates an interrupt request signal IRQ to the south bridge 14 (step 108) and the south bridge 14 in turns generates a command signal SC to the keyboard controller 21 to obtain the scan code from the data register 212 of the keyboard controller 21 (step 109).

Figure 5:
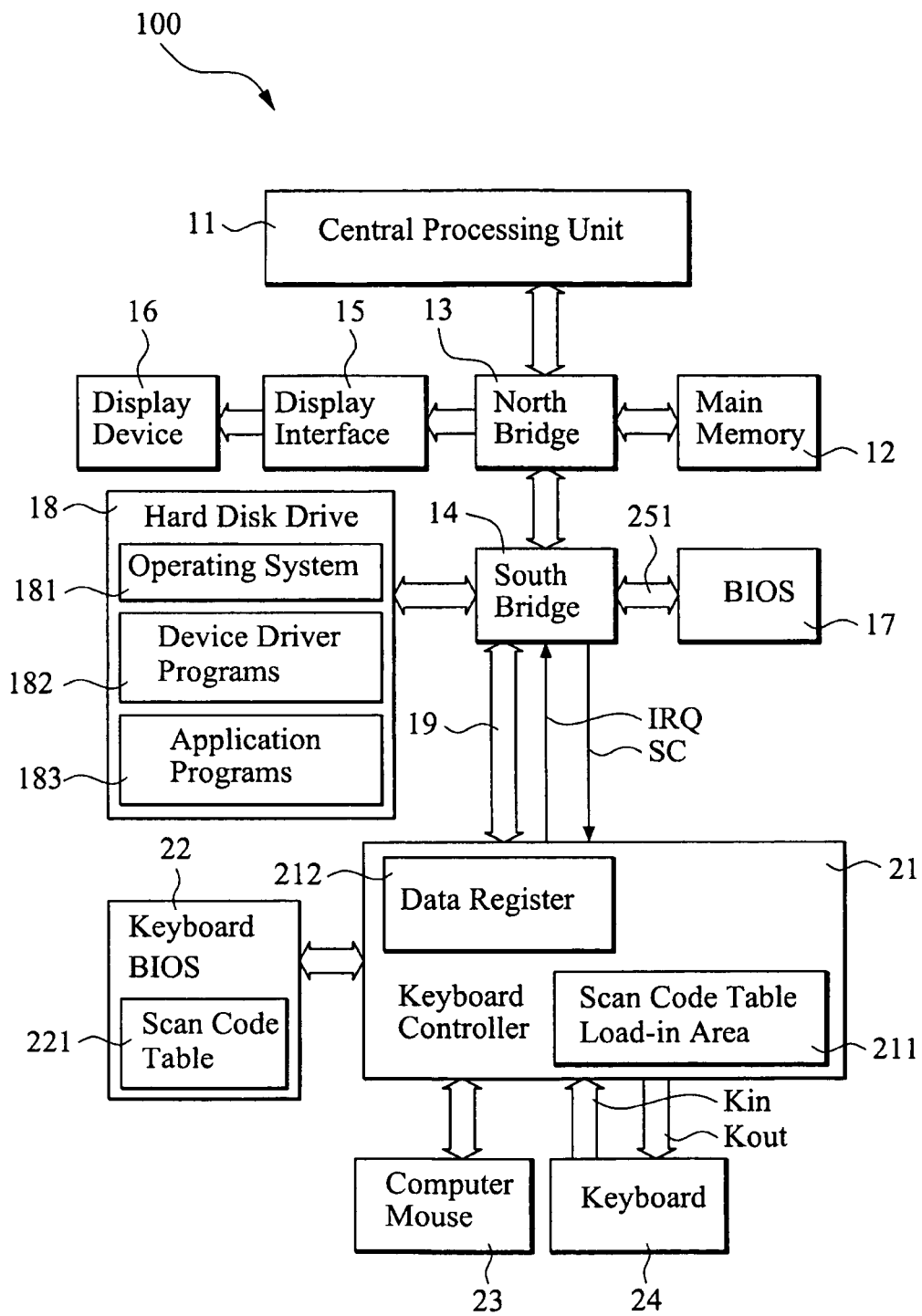
FIG. 5 shows a schematic system connection diagram in accordance with a second embodiment of the present invention.

In the embodiment so described, the scan code table memory 25 is connected, as an external memory, to the keyboard controller 21 via the bus 251. Alternatively, the present invention may directly use the KB-BIOS 22 to serve as the external memory for the keyboard controller 21. As shown in FIG. 5, which illustrates a schematic system connection diagram in accordance with a second embodiment of the present invention, of which most of the components are similar or identical to those of the embodiment described previously with reference to FIG. 1 so that those similar or identical components are designated with the same or identical reference numerals for simplicity, the KB-BIOS 22 stores the scan code table 221 in advance. The keyboard controller 21, after being initialized, loads the scan code table 221 from the KB-BIOS 22 to the scan code table load-in area 211 of the keyboard controller 21. Except this, the flow of operation of the second embodiment is identical to the flow of operation of the first embodiment described with reference to FIG. 4.

Figure 6:
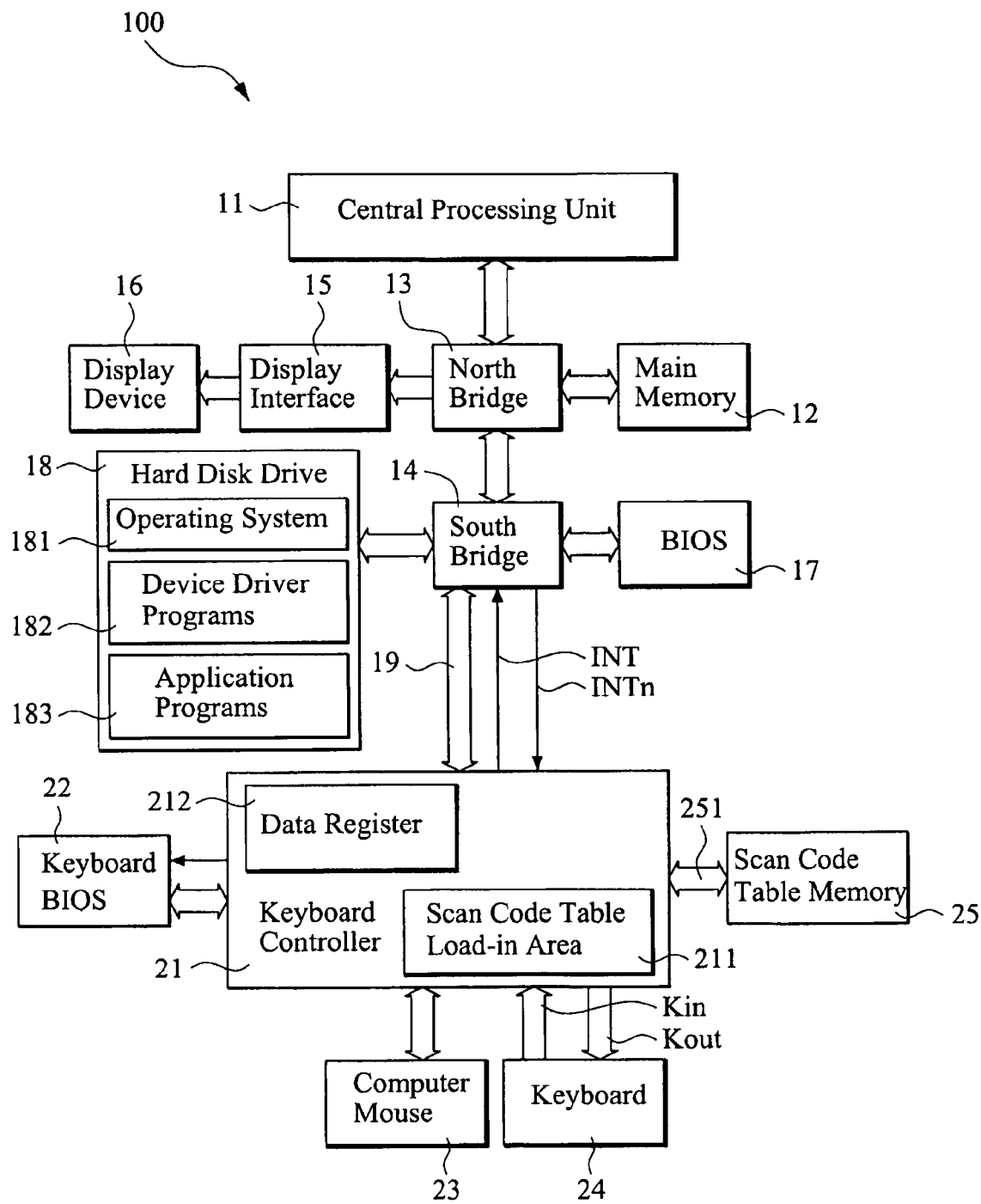
FIG. 6 shows a schematic system connection diagram in accordance with a third embodiment of the present invention.

FIG. 6 shows a schematic system connection diagram in accordance with a third embodiment of the present invention, wherein most of the components are similar or identical to the counterpart components of the first embodiment described with reference to FIG. 1 so that similar or identical components will bear the same or identical reference numerals for simplicity. In the third embodiment illustrated in FIG. 6, the keyboard controller 21 and the south bridge 14 communicate each other with control signals that include an interrupt signal INT and an interrupt query number retrieval signal INTn.

Figure 7:
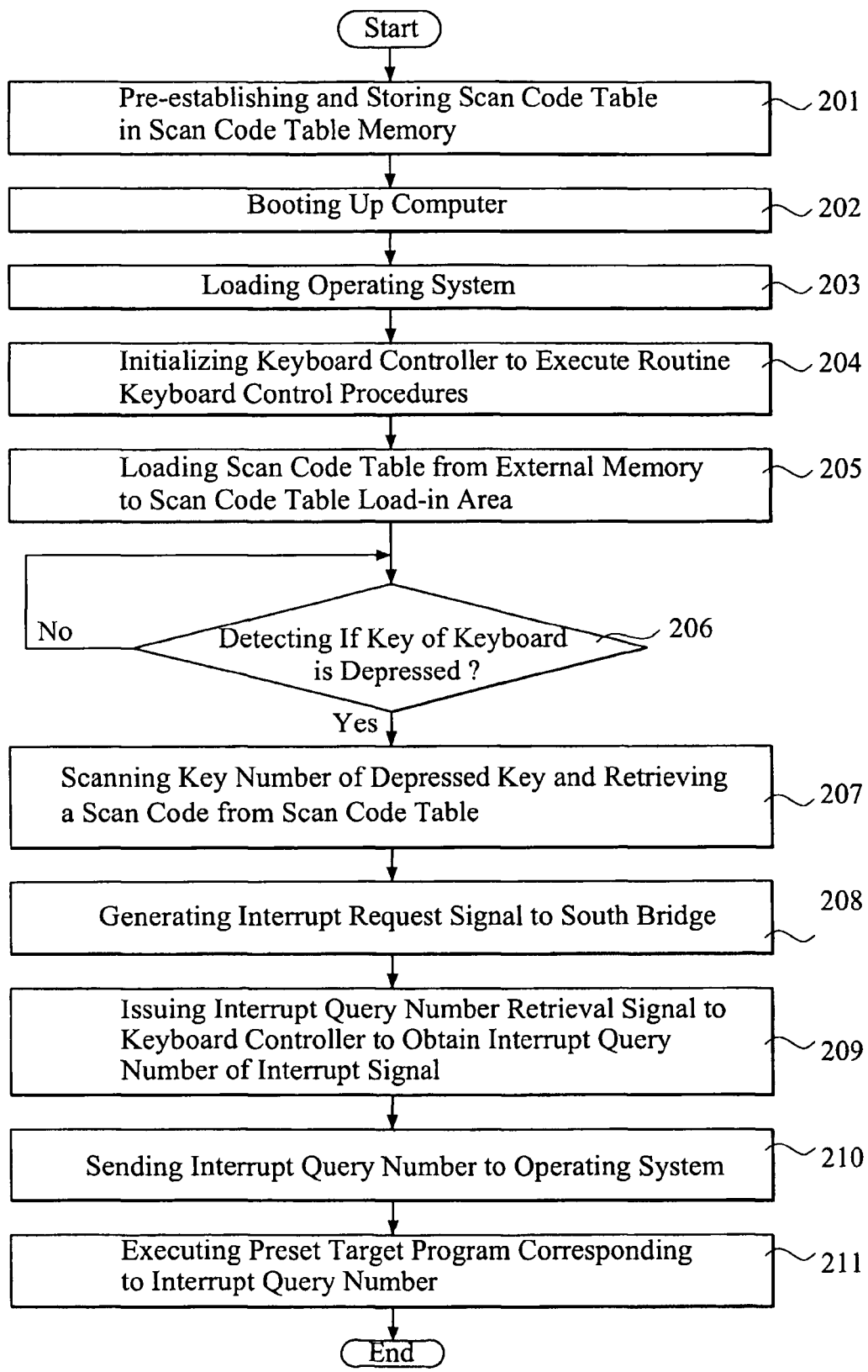
FIG. 7 shows a flow chart of the third embodiment illustrated in FIG. 6.

FIG. 7 shows a flow chart associated with the third embodiment shown in FIG. 6. First of all, a scan code table is pre-established in the computer device 100 and is stored in the scan code table memory 25 (step 201). When the computer 100 is booted up (step 202) and loads in an operating system (step 203), the keyboard controller 21 is initialized to execute routine keyboard control procedures (step 204), such as battery detection, keyboard detection, and ON/OFF status detection.

At this time, in step 205, the keyboard controller 21 loads the scan code table from the external memory (the scan code table memory 25) to a scan code table load-in area 211 inside the keyboard controller 21, which can be for example a random access memory or a register built in the keyboard controller 21.

When the keyboard controller 21 detects one of keys of the keyboard 24 is depressed or struck by a user (step 206), the keyboard controller 24 scans a key number of the depressed key, based on which the keyboard controller 24 retrieves a scan code from the scan code table that is previously loaded (step 207).

Thereafter, the keyboard controller 21 generates an interrupt signal INT to the south bridge 14 (step 208) and the south bridge 14 in turns generates an interrupt query number retrieval signal INTn to the keyboard controller 21 to obtain the interrupt query number of the interrupt signal INT (step 209). Then, the south bridge 14 sends the interrupt query number so obtained to the operating system (step 210) and the operating system executes a preset target program corresponding to the interrupt query number (step 211).

To summarize, the present invention provides the following effectiveness:

(1) The scan code table is stored in an external memory that is easily accessed by the keyboard controller so that the scan code table stored in the external memory can be easily updated and programmed.

(2) For a portable computer device, the scan code table stored in a memory or a storage device can be timely updated through graphic or non-graphic input interface of application programs and loaded into the keyboard controller.

(3) There is no need to prepare different versions of keyboard controller to meet various requirements for keyboards at the client end.

(4) The client end may use the graphic or non-graphic input interface of the application programs to make their own programming of the functions of the keyboard.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for detecting and processing key scan codes of a computer keyboard electrically connected to a computer device comprising a central processing unit, a basic input/output system, a north bridge, a south bridge, the computer device being operated with an operating system, a keyboard controller being connected to the central processing unit through the south bridge and the north bridge, the keyboard controller comprising a data register and connected to a keyboard basic input/output system and a keyboard comprising a plurality of keys, the method comprising the following steps:

(a) establishing and storing at least one scan code table in an external scan code table memory that is accessible by the keyboard controller via a bus, each scan code table containing a plurality of sets of correlated data of keys and corresponding scan codes;

(b) the keyboard controller, after being initialized, loading one scan code table from the external scan code table memory into a scan code table load-in area of the keyboard controller;

(c) the keyboard controller, upon detecting actuation of one of the keys of the keyboard, retrieving a corresponding scan code from the loaded scan code table and generating an interrupt request signal to the south bridge; and (d) the south bridge issuing a command signal to the keyboard to retrieve the corresponding scan code from the data register of the keyboard controller;

wherein a plurality of scan code tables are provided in the external scan code table memory, and a selection signal is applied between the keyboard controller whereby the keyboard controller selects and retrieves a selected scan code table among a plurality of scan code tables for loading in the scan code table load-in area.

2. The method as claimed in claim 1, wherein the external scan code table memory comprises a read-only memory burnt in with the plural sets of correlated data of keys and corresponding scan codes.

3. The method as claimed in claim 1, wherein the external scan code table memory comprises an erasable writable memory whereby the correlated data of keys and corresponding scan codes of the plurality of scan code tables are updateable.

4. The method as claimed in claim 1, wherein the scan code table load-in area is a random access memory.

5. The method as claimed in claim 1, wherein the scan code table load-in area is a register.

6. A method for detecting and processing key scan codes of a computer keyboard electrically connected to a computer device comprising a central processing unit, a basic input/output system, a north bridge, a south bridge, the computer device being operated with an operating system, a keyboard controller being connected to the central processing unit through the south bridge and the north bridge, the keyboard controller comprising a data register and connected to a keyboard basic input/output system and a keyboard comprising a plurality of keys, the method comprising the following steps:

(a) establishing and storing at least one scan code table in an external scan code table memory that is accessible by the keyboard controller via a bus, each scan code table containing a plurality of sets of correlated data of keys and corresponding scan codes;

(b) the keyboard controller, after being initialized, loading one scan code table from the external scan code table memory into a scan code table load-in area of the keyboard controller;

(c) the keyboard controller, upon detecting actuation of one of the keys of the keyboard, retrieving a corresponding scan code from the loaded scan code table and generating an interrupt signal to the south bridge;

(d) the south bridge issuing an interrupt query number retrieval signal to the keyboard controller to obtain an interrupt query number of the interrupt signal;

(e) the south bridge transmitting the interrupt query number so obtained to the operating system; and (f) the operating system executing a preset target program corresponding to the interrupt query number;

wherein a plurality of scan code tables are provided in the external scan code table memory, and a selection signal is applied between the keyboard controller whereby the keyboard controller selects and retrieves a selected scan code table among a plurality of scan code tables for loading in the scan code table load-in area.

7. The method as claimed in claim 6, wherein the external scan code table memory comprises a read-only memory burnt in with the plural sets of correlated data of keys and corresponding scan codes.

8. The method as claimed in claim 6, wherein the external scan code table memory comprises an erasable writable memory whereby the correlated data of keys and corresponding scan codes of the plurality of scan code tables are updateable.

9. The method as claimed in claim 6, wherein the scan code table load-in area is a random access memory.

10. The method as claimed in claim 6, wherein the scan code table load-in area is a register.

* * * * *